United States Patent
Chen

(10) Patent No.: US 8,023,293 B2
(45) Date of Patent: *Sep. 20, 2011

(54) ON-DIE ANTI-RESONANCE STRUCTURE FOR INTEGRATED CIRCUIT

(75) Inventor: Houfei Chen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/625,090

(22) Filed: Nov. 24, 2009

(65) Prior Publication Data

US 2010/0073972 A1    Mar. 25, 2010

Related U.S. Application Data

(63) Continuation of application No. 11/382,668, filed on May 10, 2006, now Pat. No. 7,633,773.

(51) Int. Cl.
*H02H 3/22* (2006.01)
*H02M 1/14* (2006.01)

(52) U.S. Cl. .......... 363/39; 363/147; 333/175; 333/181; 361/113; 327/329; 327/564

(58) Field of Classification Search .................. 716/10; 363/39, 147; 307/105; 361/111, 113; 327/290, 327/306, 309, 310, 311, 315, 317, 318, 319, 327/329, 551, 555, 564, 592, 594, 596; 333/172, 333/175, 176, 181, 182, 183, 184, 211, 212, 333/24 C, 185

See application file for complete search history.

(56) References Cited

U.S. PATENT DOCUMENTS

| | | | |
|---|---|---|---|
| 5,844,762 A | 12/1998 | Yamamura et al. | |
| 6,385,565 B1 | 5/2002 | Anderson et al. | |
| 6,657,484 B1 | 12/2003 | Bosshart | |
| 6,700,771 B2 | 3/2004 | Bhattacharyya | |
| 6,781,355 B2 * | 8/2004 | Gauthier et al. | 323/233 |
| 6,789,241 B2 | 9/2004 | Anderson et al. | |
| 6,822,345 B2 | 11/2004 | Gauthier et al. | |
| 6,842,351 B2 | 1/2005 | Gauthier et al. | |
| 7,075,362 B2 | 7/2006 | North | |
| 2003/0141944 A1 | 7/2003 | Daniels et al. | |
| 2004/0041665 A1 | 3/2004 | Hode et al. | |
| 2007/0262794 A1 | 11/2007 | Chen | |

* cited by examiner

*Primary Examiner* — Gary L Laxton

(74) *Attorney, Agent, or Firm* — Schwegman, Lundberg & Woessner, P.A.

(57) ABSTRACT

A structure and method for reducing the effects of chip-package resonance in an integrated circuit assembly is described. A series RLC circuit is employed to reduce the output impedance of the power delivery system at the resonance frequency.

20 Claims, 6 Drawing Sheets

M1
FREQ.=3.610GHz
MAG(ZIN)=15.550

M1
FREQ.=700.0GHz
MAG(ZIN)=0.931

ON-DIE ANTI-RESONANCE STRUCTURE FOR INTEGRATED CIRCUIT

RELATED APPLICATION

This application is a continuation of U.S. application Ser. No. 11/382,668, filed May 10, 2006, now U.S. Pat. No. 7,633,773 which is incorporated herein its entirety by reference.

FIELD OF THE INVENTION

This invention relates to electronic circuitry and, in particular, to integrated circuit structures and their methods of construction.

BACKGROUND

The electronic components of an integrated circuit chip, in order to operate properly, need to be supplied with a constant power voltage as defined by a specified tolerance range (e.g., 5%). Available regulated power supplies for integrated circuits may readily meet such a tolerance at DC frequencies. The components of a typical integrated circuit, however, include high-speed switches that transiently draw current at very high frequencies. As the operating frequency increases, the output impedance of the power delivery system increases due to inductance in the system, contributed primarily by conductors that connect the chip to a package structure in a completed integrated circuit assembly. Such increased output impedance can cause the voltage supplied to the chip to drop below tolerance. Decoupling capacitors, or decaps, may be added to the system in parallel with the inductance in order to reduce the output impedance. The decoupling capacitance added to the chip lowers the output impedance of the power delivery system at high frequencies because capacitor impedance is inversely proportional to frequency. Decaps, usually located on the chip near the current drawing components, store charge and give energy back to the chip components as needed which tends to hold the power supply voltage constant during high frequency operation. With decoupling capacitors, it is possible to make a low impedance power delivery system that meets a specified target impedance up to very high frequencies (e.g., several hundred Mhz).

As noted above, the power delivery system possesses both inductance, mainly due to the package connections, and capacitance, due to decaps as well as the inherent capacitance on the chip due to various components and structures. The inductance of the package, however, forms a parallel RLC circuit with the capacitance of the chip that resonates at the frequency $f=1/2\pi(LC)^{1/2}$, where L is the equivalent series inductance of the system and C is the total capacitance on the chip between the voltage and ground nodes. The impedance of an inductance in parallel with a capacitance is maximized at the resonance frequency. At that frequency, the chip components therefore see a high output impedance from the power delivery system, usually much higher than the target impedance. The capacitance on the chip is not low enough in impedance and does not store enough charge to deliver the current needed by the chip components at the resonance frequency. The electronic components of the chip may then be starved for current, and the power supply voltage supplied to the chip can drop out of the specified tolerance range.

DETAILED DESCRIPTION

In the design of high-speed digital systems, the power delivery system has assumed greater importance due to the ever increasing requirements of integrated circuit chips for higher current consumption and lower supply voltages. A good power delivery system should deliver a relatively constant voltage to its load and generate as little voltage noise as possible. One parameter that reflects the performance of a power delivery system is its output impedance, which can be defined as the rate at which the supplied voltage changes with respect to load current. The output impedance thus indicates how much voltage noise will be induced on a power rail for given specific current consumption, where the latter may vary over a wide range of frequencies. Due to the randomness of bit patterns that can occur in a typical digital system, a noise current profile could have a frequency content that spans virtually the entire spectrum. If the power delivery system is not able to adequately supply current at certain frequencies, significant voltage fluctuations can occur that lead to system failure. It is therefore required that the power delivery impedance be below the target impedance over the entire system bandwidth. The target impedance is usually determined by a specified voltage margin and current profile for a specific system. For example, if a part has a current profile with an amplitude of 20 mA at a certain frequency and a voltage margin of 20 mV, then the target impedance at that frequency is 1 Ohm.

As above, a power delivery system possesses both inductance, mainly due to the package connections, and capacitance such that the inductance of the package, forms a parallel RLC circuit with the capacitance of the chip that resonates at a particular frequency to result in an increased output impedance, referred to as chip-package resonance. Described herein is a structure and method for reducing the effects of chip-package resonance in an integrated circuit assembly. In one embodiment, the integrated circuit assembly comprises an integrated circuit structure that includes a chip having electronic circuit components fabricated therein with the chip being connected to a package, a power delivery path incorporated into the integrated circuit structure for receiving power from a power supply, wherein the impedance of the power delivery path exhibits at least one resonance peak at a particular operating frequency of the electronic circuit components due to the inductance and capacitance associated with the chip and package, and a series RLC circuit connected to the integrated circuit structure, wherein the component values of the RLC circuit are selected to reduce the resonance peak of the power delivery path impedance.

Figure 1:
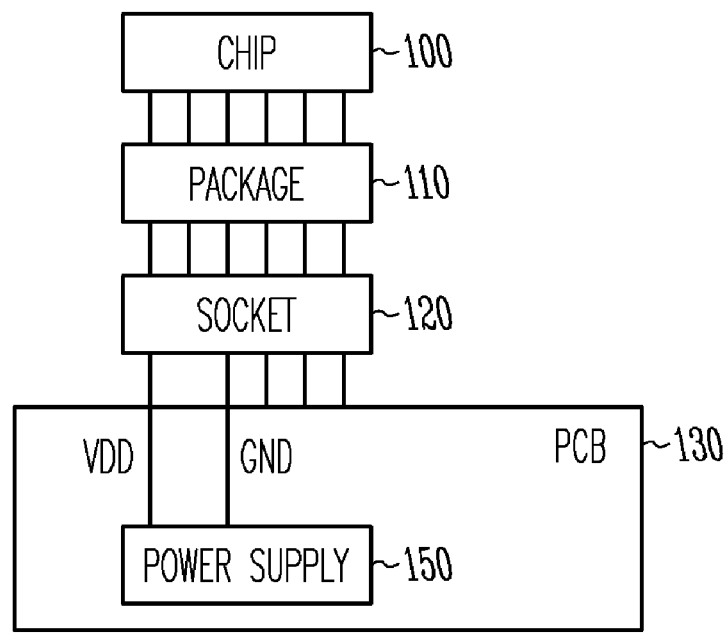
FIG. 1 depicts an exemplary integrated circuit assembly.

FIG. 1 shows a cross section of an exemplary integrated circuit chip 100 (also referred to as a die) mounted on an electronic package 110. The chip or die 100 is made of a semiconductor such as silicon and has various electronic components (mainly transistors) fabricated therein. The chip may be, for example, a microprocessor or a memory chip. The chip 100 and package 110 are attached to a printed circuit board or PCB 130 through a socket 120. Conductors 140 provide both signal and power paths between the PCB 130 and the chip 100 through the package 110 and socket 120. The power delivery system includes a regulated power supply 150 that connects to $V_{dd}$ and ground power planes in the PCB 130. The $V_{dd}$ and ground power planes are connected to corresponding power paths that convey power through the socket 120 and package 110 and then finally to the electronic components of the chip 100.

Figure 2:
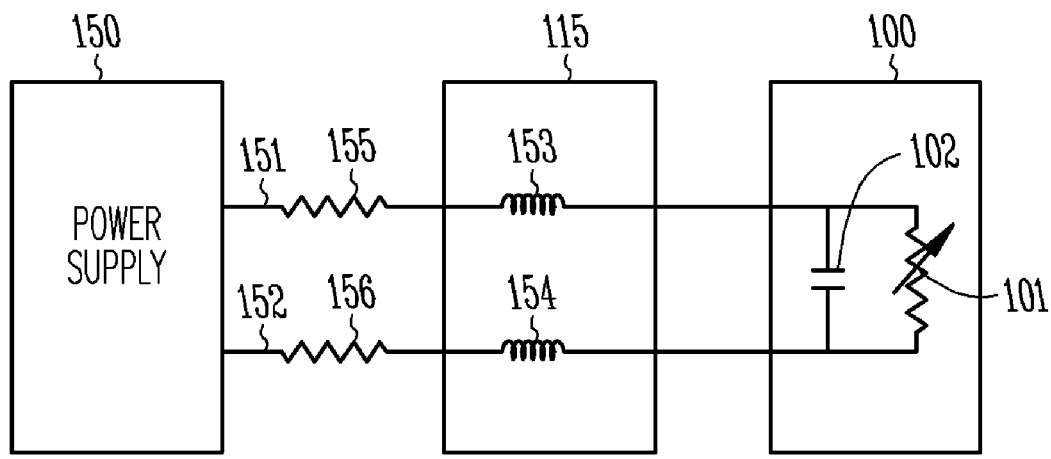
FIG. 2 shows an electrical equivalent of the integrated circuit assembly.

The physical structure depicted in FIG. 1 can be electrically modeled as shown in FIG. 2. The power supply 150 connects its ground and power terminals to power paths 151 and 152 that traverse the socket and package combination 115 and then connect to a variable resistor 101 within the chip 100 representing the load. In each of the power paths are inductors 153 and 154 that represent the total inductance in the power delivery system as contributed primarily by the package. Resistors 155 and 156 represent the total resistance in the power paths that result in a resistive voltage drop (IR drop) as current flows through the system. A capacitor 102 is connected in parallel with the variable resistor 101 to represent the capacitance of the system as contributed by the decaps added for decoupling and the inherent capacitance of the chip components. In operation, the variable resistor 101 variably draws current from the power supply at different frequencies as the components of the chip switch on and off in response to program code, for example. At high frequencies of current draw, the voltage drop across the inductors 153 and 154 becomes significant. The capacitor 102, representing the decaps, counteracts the inductive voltage drop by alternately charging and supplying current to the variable resistor 101 in a manner that keeps the voltage seen by the resistor relatively constant. From the viewpoint of the output impedance of the power delivery system as seen from the resistor 101, the capacitor 102 connected across the power paths presents a low AC impedance at high frequencies. As the frequency decreases, however, the impedance of the capacitor 102 increases, with the total output impedance as seen from the chip reaching a maximum when the frequency reaches the resonance frequency of the parallel combination of capacitor 102 and inductors 153 and 154. At this point, the total output impedance of the power delivery system may exceed the target impedance so that the voltage supplied to the chip becomes inadequate for proper operation.

Figure 3:
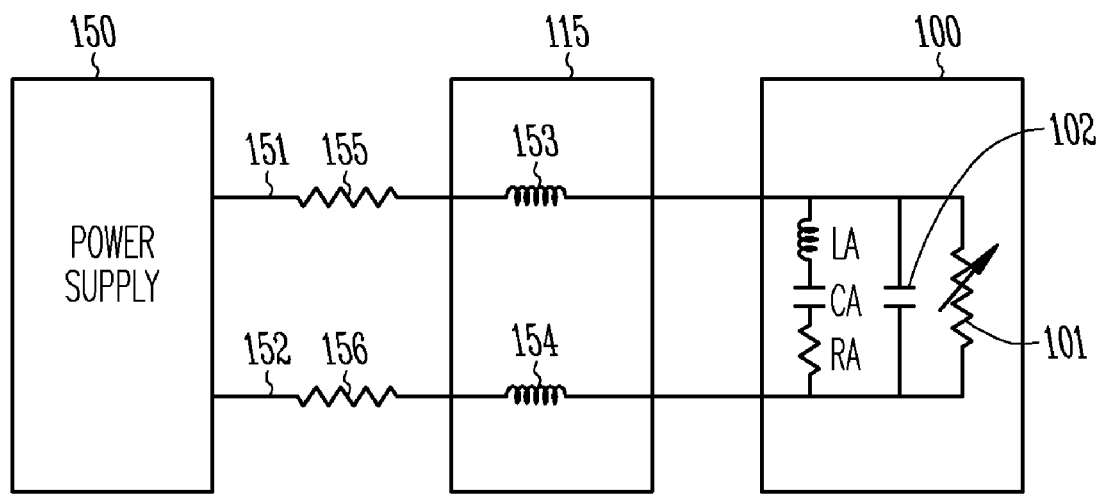
FIG. 3 shows the integrated circuit assembly with an anti-resonance structure added.

In order to counteract the undesirable resonance effects described above, an anti-resonance structure can be added as shown in FIG. 3. In this embodiment, the anti-resonance structure is a series RLC circuit connected in parallel with the capacitor 102 and is made up of a resistor $R_a$, an inductor $L_a$, and a capacitor $C_a$. The anti-resonance structure is preferably located on the chip but could also be located elsewhere. In operation, the anti-resonance structure is designed to resonate at approximately the same frequency as the parallel combination of capacitor 102 and inductors 153 and 154. At the operating frequency at which the output impedance would otherwise be at its maximum as described above, the impedance of the anti-resonance structure is minimized so that the overall output impedance is decreased. Ideally, the decrease in the output impedance brought about by the anti-resonance structure maintains the output impedance below the target impedance as the operating frequency varies.

Figure 4:
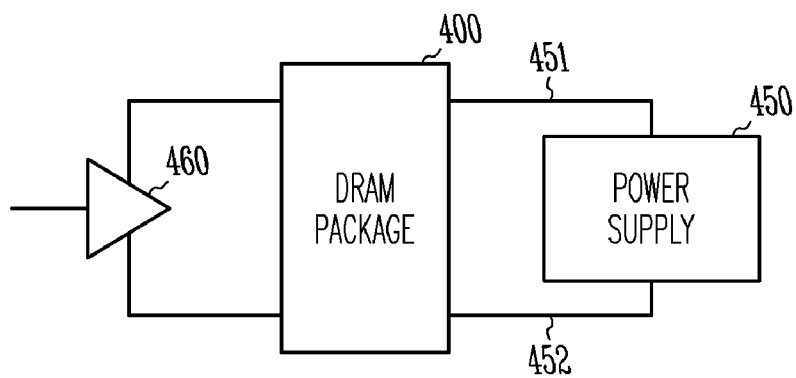
FIG. 4 depicts an exemplary integrated circuit assembly that includes a DRAM package.
Figure 5:
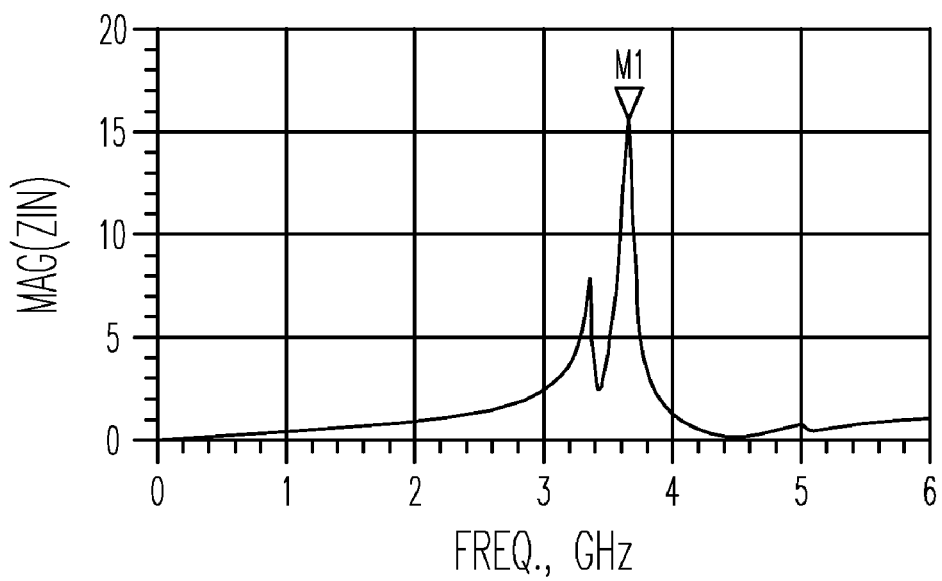
FIG. 5 shows the output impedance of the assembly depicted in FIG. 4.
Figure 6:
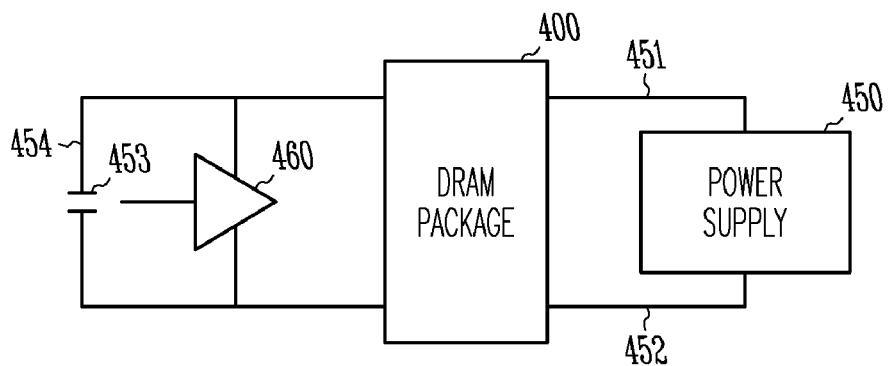
FIG. 6 depicts the assembly of FIG. 4 with an added decap.
Figure 7:
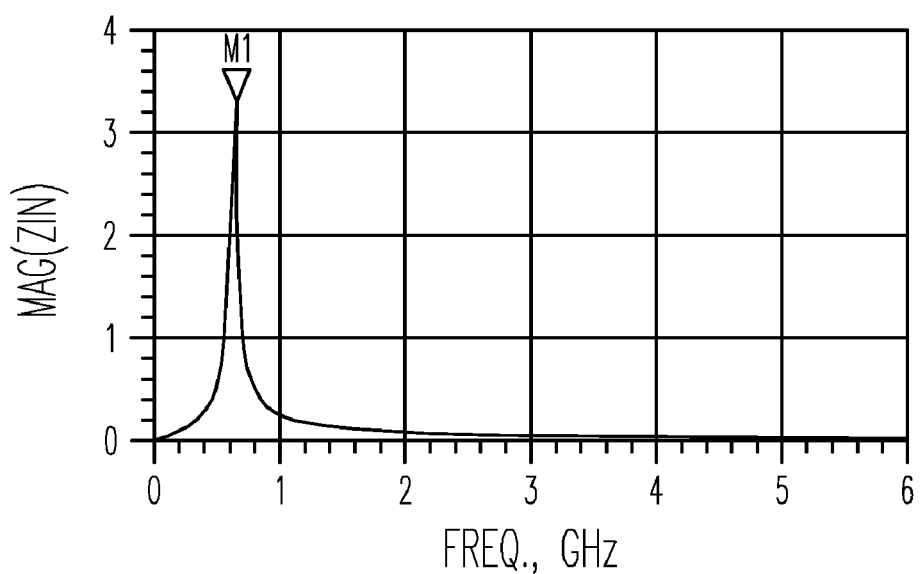
FIG. 7 shows the output impedance of the assembly depicted in FIG. 6.

FIG. 4 illustrates a DRAM package 400 connected to an ideal power supply 450 that has been simulated in order to demonstrate the effects of the anti-resonance structure described above. The system includes power rail 451 and ground rail 452 that distribute power from the power supply 450 through the package and into the DRAM chip. The power supply is shown as being connected to the ball side of the package. On the die side of the package is shown an exemplary driver 460. FIG. 5 shows the output impedance of the power delivery system as looking from the die side between the power rails without any decoupling. It shows that at 3.61 GHz, the power delivery structure has an impedance of 15.55 Ohm. If the current drawn by the chip has an amplitude of 20 mA at 3.61 GHz, it will induce a voltage noise of 311 mV, which is unacceptable for most low voltage applications. To improve the performance of the power delivery system, one or multiple stages of decoupling capacitors can be added. For high frequency decoupling, on-die decaps are much more effective than on-package or onboard decap due to little or no associated ESL (equivalent series inductance). FIG. 6 shows the system of FIG. 4 with a representative decap 453 added between the power rail 451 and ground rail 452. FIG. 7 shows the impedance of the same power delivery system in FIG. 4 but with 1000 pF of on-die decap. The original resonance peak at 3.61 GHz disappears and the overall impedance is greatly reduced. However, adding on-die decaps inevitably creates parallel resonance with the package inductance, shown in FIG. 7 as a resonance at 630 MHz. This resonance still has an impedance of 3.286 Ohm which could exceed target impedance.

Different methods could be used to suppress this parallel resonance peak. A controlled series damping resistance could be added to the package, but that would increase the IR drop at low frequency. Another alternative is to add series damping resistance with on-die decap, but that would increase the IR drop at high frequency. The resonance could be reduced without increasing IR drop by adding more on-die decap, but this consumes several times more die space (to reduce the peak impedance by N-fold, the on-die decap generally needs to increase N-fold).

Figure 8:
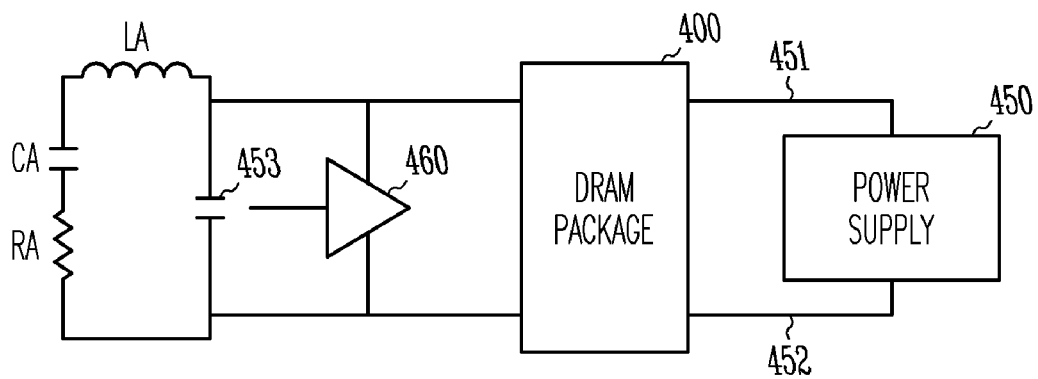
FIG. 8 depicts the assembly of FIG. 6 with an anti-resonance structure added.

The on-die anti-resonance structure described herein effectively suppresses the parallel resonance created by on-die decaps and package inductance without the disadvantages of the alternative techniques enumerated above. FIG. 8 illustrates the anti-resonance structure added to the power delivery system of FIG. 4 as a series RLC circuit in parallel with the on-die decaps and made up of resistor Ra, inductor La, and capacitor Ca. The structure generally only consumes several percent of on-die decap space and can be placed relatively flexibly around the I/O circuitry of the chip (e.g., it does not need to be immediately next to the driver 460 as do on-die decaps). Since the structure is in parallel with the on-die decap, it does not introduce any additional IR drop at either high or low frequencies. The resonance frequency of the structure, as determined by the values of La and Ca, is carefully selected or calculated to effectively reduce the parallel resonance peak. The resistor Ra acts to damp the entire resonance loop without introducing additional IR drop. In FIG. 7, with on-die decap, the power delivery impedance shows a resonance at 630 MHz. In order to cancel this parallel resonance, the values of Ra and La are selected to create a series resonance at 630 MHz as well. The capacitance is chosen at Ca=80 pF in this example for simplicity making the inductance value of La 0.78 nH. The value of the damping resistor Ra may be set as an optimization variable in ADS (Advance Design System) simulation tools to obtain critical damping of the resonance circuitry. The optimization process results in a resistance value Ra of 1.15 Ohm. These values of Ca, La and Ra are all easily realized as an on-die structure.

Figure 9:
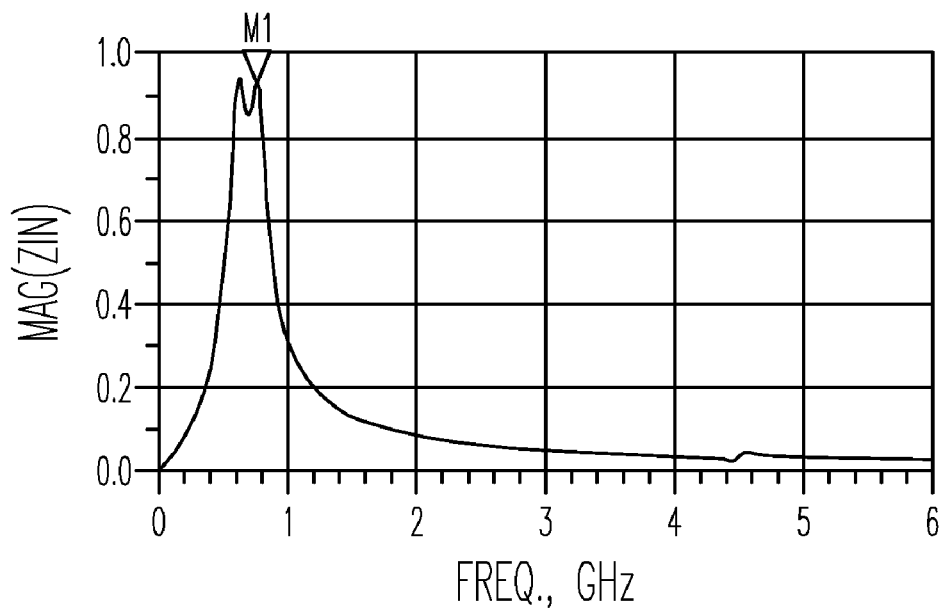
FIG. 9 shows the output impedance of the assembly depicted in FIG. 8.
Figure 10:
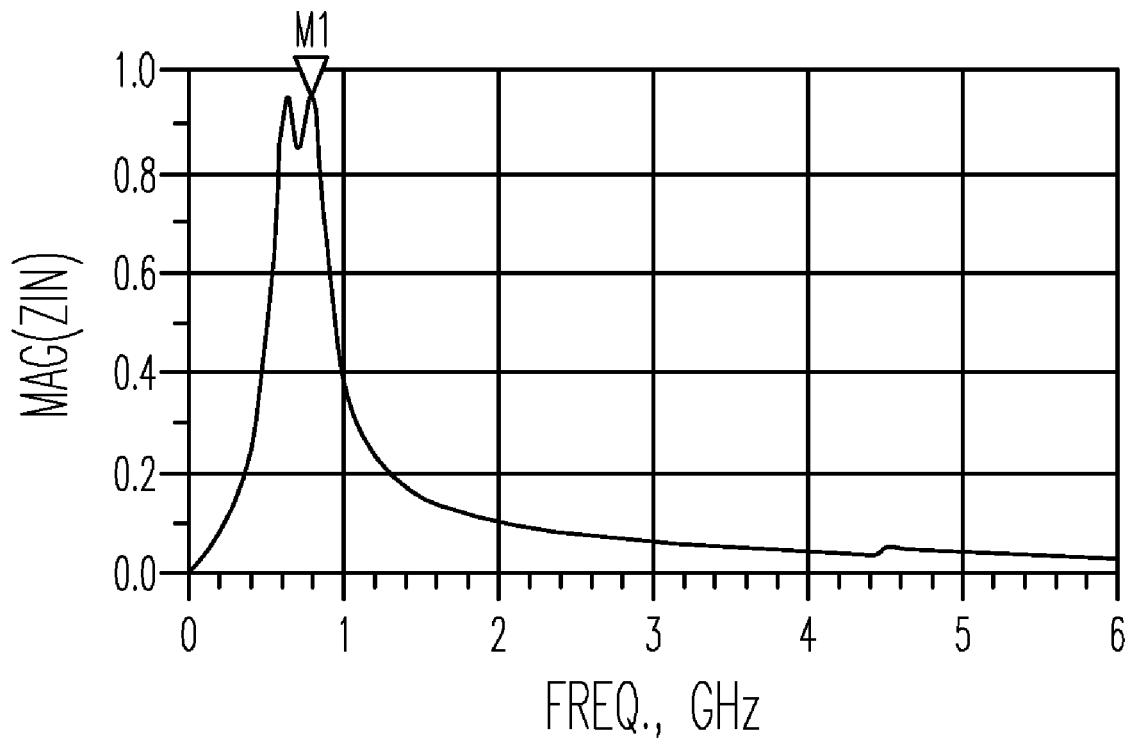
FIG. 10 shows the output impedance of the assembly depicted in FIG. 8 with a different decap capacitance.

The simulation results for the anti-resonance structure are shown in FIG. 9. The peak impedance is reduced from 3.286 Ohm in FIG. 6 to 0.931 Ohm, and no additional IR drop is introduced at either low or high frequencies. Also, if a portion of the on-die decap space is reserved for the anti-resonance structure, then virtually no additional die space is required for the implementation. FIG. 10 shows the same simulation but, instead of using 1000 pF of on-die decap, 920 pF of on-die decap is used instead, reserving the remaining 80 pF for the anti-resonance structure. Since the parallel resonance created by 920 pF of on-die decap is slightly different with that of 1000 pF, the inductance value La in the anti-resonance structure is slightly tuned to 0.72 nH. The result is that the peak impedance is reduced from 3.286 Ohm to 0.953 Ohm.

In different embodiments, the capacitance element of the anti-resonance structure may be implemented by using several percent more of on-die decap space or simply reducing the on-die decap space by several percent and using the freed up space for the capacitance element of the anti-resonance structure. Since the anti-resonance structure can be placed flexibly around the I/O circuitry, the connecting metal trace 454 from the structure to the on-die decap could be used as the inductance element. The trace width and trace length may be easily adjusted (since the anti-resonance structure may be flexibly located) to obtain an inductance value that results in the appropriate resonance frequency for the anti-resonance structure. The metal trace may also serve as the resistance element of the structure. Alternatively, a poly-resistor could be used. Precise calculation of the trace length and width can be performed using a 3D electromagnetic field solver or a similar extraction tool.

The on-die anti-resonance structure as described herein may find applications in low-voltage, high-speed signaling chips, especially since on-die decaps have become more widely used for high-frequency decoupling of power delivery systems. As the supply voltage of digital systems is pushed ever lower even while the current consumption of the system increases, the performance requirements of the power delivery system becomes more stringent. The wide use of on-die decaps inevitably brings along the parallel resonance problem in the impedance profile which poses a serious threat to the overall power integrity of the system. The anti-resonance structure as described effectively addresses this parallel resonance problem. It reduces the peak impedance at resonance region by several times with little or no additional die space, or any adverse effect on other frequency range of the impedance profile. A several times reduction in impedance directly translates to several times reduction of voltage fluctuation given the same current profile, which can be quite significant in a low voltage application.

Although the invention has been described in conjunction with the foregoing specific embodiment, many alternatives, variations, and modifications will be apparent to those of ordinary skill in the art. Such alternatives, variations, and modifications are intended to fall within the scope of the following appended claims.

What is claimed is:

1. An integrated circuit structure, comprising:
a package for an integrated circuit chip;
an integrated circuit chip connected to the package;
a power delivery path incorporated into the integrated circuit structure for receiving power from a power supply, wherein the impedance of the power delivery path exhibits at least one resonance peak at an operating frequency due to inductance and capacitance associated with the chip and package;
a series RLC circuit connected to the integrated circuit structure, wherein the series RLC circuit has resistance, inductance, and capacitance components; and,
wherein the inductance component of the series RLC circuit is implemented with a conducting metal trace having dimensions such that the resonance frequency of the series RLC circuit approximately matches the frequency of the resonance peak of the power delivery path impedance.

2. The integrated circuit structure of claim 1 wherein the resistance component of the series RLC circuit is implemented with the conducting metal trace.

3. The integrated circuit structure of claim 1 further comprising a printed circuit board to which are attached the integrated circuit and package.

4. The integrated circuit structure of claim 1 wherein the series RLC circuit is located on the integrated circuit chip.

5. The integrated circuit structure of claim 1 wherein the series RLC circuit is placed in parallel with the capacitance associated with the integrated circuit chip.

6. The integrated circuit structure of claim 1 wherein the capacitance associated with the integrated circuit chip includes one or more decoupling capacitors.

7. The integrated circuit structure of claim 1 wherein the capacitance component of the series RLC circuit is implemented with one or more decoupling capacitors.

8. The integrated circuit structure of claim 1 wherein the trace width and trace length of the conducting metal trace are adjusted using an electromagnetic solver so that the resonance frequency of the series RLC circuit approximately matches the frequency of the resonance peak.

9. The integrated circuit structure of claim 1 wherein the resistance component of the series RLC circuit is implemented with the conducting metal trace connected to one or more decoupling capacitors.

10. The integrated circuit structure of claim 1 wherein the resistance component of the series RLC circuit is implemented with a poly-resistor.

11. The integrated circuit structure of claim 1 wherein the integrated circuit is a memory chip.

12. The integrated circuit structure of claim 1 wherein the integrated circuit is a microprocessor.

13. The integrated circuit structure of claim 11 further comprising a printed circuit board to which are attached the integrated circuit and package.

14. The integrated circuit structure of claim 11 wherein the resistance component of the series RLC circuit is implemented with the conducting metal trace.

15. The integrated circuit structure of claim 11 wherein the capacitance component of the series RLC circuit is implemented with one or more decoupling capacitors.

16. The integrated circuit structure of claim 11 wherein the capacitance associated with the integrated circuit chip includes one or more decoupling capacitors.

17. The integrated circuit structure of claim 11 wherein the series RLC circuit is located on the integrated circuit chip.

18. The integrated circuit structure of claim 11 wherein the series RLC circuit is placed in parallel with the capacitance associated with the integrated circuit chip.

19. The integrated circuit structure of claim 12 wherein the capacitance associated with the integrated circuit chip includes one or more decoupling capacitors.

20. The integrated circuit structure of claim 12 wherein the capacitance component of the series RLC circuit is implemented with one or more decoupling capacitors.

* * * * *